(12) United States Patent
Peng et al.

(10) Patent No.: US 12,211,811 B2
(45) Date of Patent: Jan. 28, 2025

(54) ELECTRONIC DEVICE AND METHOD OF MANUFACTURING ELECTRONIC DEVICE

(71) Applicant: Industrial Technology Research Institute, Hsinchu (TW)

(72) Inventors: Yu-Ming Peng, Taichung (TW); Chien-Chou Tseng, Hsinchu (TW); Chih-Chia Chang, Hsinchu County (TW); Kuan-Chu Wu, Kaohsiung (TW); Yu-Lin Hsu, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 328 days.

(21) Appl. No.: 17/702,812

(22) Filed: Mar. 24, 2022

(65) Prior Publication Data

US 2023/0154877 A1 May 18, 2023

(30) Foreign Application Priority Data

Nov. 16, 2021 (TW) ................. 110142630

(51) Int. Cl.
*H01L 23/00* (2006.01)
*H01L 21/66* (2006.01)
(Continued)

(52) U.S. Cl.
CPC .............. *H01L 24/06* (2013.01); *H01L 22/20* (2013.01); *H01L 23/13* (2013.01); *H01L 24/05* (2013.01);
(Continued)

(58) Field of Classification Search
CPC ......... H01L 24/06; H01L 22/20; H01L 23/13; H01L 24/05; H01L 24/08; H01L 24/16;
(Continued)

(56) References Cited

U.S. PATENT DOCUMENTS

| 11,304,290 B2 * | 4/2022 | Yu ..................... H01L 23/49816 |
| 11,616,051 B2 * | 3/2023 | Kim ........................ H01L 25/50 |
| | | 257/668 |
| 2011/0237952 A1 | 9/2011 | Doishi et al. |

FOREIGN PATENT DOCUMENTS

| CN | 111564547 | 8/2020 |
| TW | 201633862 | 9/2016 |
| TW | 201935580 | 9/2019 |

OTHER PUBLICATIONS

"Office Action of Taiwan Counterpart Application", issued on Jun. 9, 2022, p. 1-p. 10.

* cited by examiner

*Primary Examiner* — Douglas W Owens
(74) *Attorney, Agent, or Firm* — JCIPRNET

(57) ABSTRACT

An electronic device includes a substrate, an electronic component, a first interposing layer and a second interposing layer. The substrate is non-planar and the substrate includes a first substrate pad and a second substrate pad. The electronic component includes a first component pad and a second component pad corresponding to the first substrate pad and the second substrate pad respectively. When the first component pad contacts the first substrate pad, a height difference exists between the second component pad and the second substrate pad. The first interposing layer connects between the first component pad and the first substrate pad. The second interposing layer connects between the second component pad and the second substrate pad. A thickness difference between the first interposing layer and the second interposing layer is 0.5 to 1 time the height difference.

19 Claims, 9 Drawing Sheets

(51) Int. Cl.
    *H01L 23/13*    (2006.01)
    *H01L 23/14*    (2006.01)
    *H01L 33/62*    (2010.01)

(52) U.S. Cl.
    CPC .............. *H01L 24/08* (2013.01); *H01L 24/16* (2013.01); *H01L 24/80* (2013.01); *H01L 24/81* (2013.01); *H01L 33/62* (2013.01); *H01L 23/145* (2013.01); *H01L 24/13* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05686* (2013.01); *H01L 2224/0569* (2013.01); *H01L 2224/05693* (2013.01); *H01L 2224/0603* (2013.01); *H01L 2224/08238* (2013.01); *H01L 2224/13186* (2013.01); *H01L 2224/1319* (2013.01); *H01L 2224/13193* (2013.01); *H01L 2224/16227* (2013.01); *H01L 2224/80411* (2013.01); *H01L 2224/80424* (2013.01); *H01L 2224/80439* (2013.01); *H01L 2224/80444* (2013.01); *H01L 2224/80447* (2013.01); *H01L 2224/80455* (2013.01); *H01L 2224/80486* (2013.01); *H01L 2224/8049* (2013.01); *H01L 2224/80493* (2013.01); *H01L 2224/81191* (2013.01); *H01L 2224/81192* (2013.01); *H01L 2224/81411* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2924/0549* (2013.01)

(58) Field of Classification Search
    CPC ......... H01L 24/80; H01L 24/81; H01L 33/62; H01L 23/145; H01L 24/13; H01L 2224/0603; H01L 2224/08238; H01L 2224/13186; H01L 2224/1319; H01L 2224/16227; H01L 2224/80493; H01L 2224/81191; H01L 2224/81192; H01L 2224/1403; H05K 2201/09018; H05K 1/189

See application file for complete search history.

ELECTRONIC DEVICE AND METHOD OF MANUFACTURING ELECTRONIC DEVICE

CROSS-REFERENCE TO RELATED APPLICATION

This application claims the priority benefit of Taiwanese application no. 110142630, filed on Nov. 16, 2021. The entirety of the above-mentioned patent application is hereby incorporated by reference herein and made a part of this specification.

BACKGROUND

Technical Field

The present disclosure relates to an electronic device and method of manufacturing the electronic device.

Description of Related Art

It is necessary to create new design to satisfy the rapid increase of compositions of electronic components as circuits become finer and finer. In view of this, the ability to embed electronic components in injection molding device, or the like, has given birth to the rise of in-mold electronics (IME) technology.

IME is a new way to realize advanced circuit design and architecture. Two-layer film is molded to become a double-sided molded component, wherein one side is used for decoration, and film circuit is molded to the other side, and resin is usually injected between these two films. This type of in-mold electronics using a two-layer film approach provides a way to integrate important characteristics, and is usually where the application of a single-layer film cannot or is challenging to be achieved.

In addition, the technology of in-mold electronics can increase the flexibility in design, so that the printed circuit has 3D deformability, and has the advantages of good flexibility and high stretchability. However, the current electronic component disposed on the curved substrate only has very limited flexibility, and the flexure of the electronic component may have a negative impact on performance due to the asymmetry of the mechanical stress on the crystal structure. Therefore, the placement of a substantially planar electronic component on various non-planar substrates is prone to stress concentration problems, which in turn leads to poor electrical connections and electrical performance, and even damages to the electronic component.

SUMMARY

The present disclosure provides an electronic device includes a substrate, an electronic component, a first conductive interposing layer, and a second conductive interposing layer. The substrate includes a substrate bonding surface, which is non-planar, and a first substrate pad and a second substrate pad disposed on the bonding surface. The electronic component includes a component bonding surface and a first component pad and a second component pad disposed on the component bonding surface and corresponding to the first substrate pad and the second substrate pad, respectively. When the first component pad contacts the first substrate pad, there is a height difference between the second component pad and the second substrate pad. The first conductive interposing layer is connected between the first substrate pad and the first component pad. The second conductive interposing layer is connected between the second substrate pad and the second component pad, wherein a thickness difference between the first conductive interposing layer and the second conductive interposing layer is from 0.5 to 1 times the height difference.

The present disclosure provides a method of manufacturing an electronic device including the following steps. A substrate is provided, wherein the substrate includes a substrate bonding surface, which is non-planar, and a first substrate pad and a second substrate pad disposed on the bonding surface. An electronic component is provided, wherein the electronic component includes a first component pad and a second component pad corresponding to the first substrate pad and the second substrate pad respectively. A height difference is obtained according to a radius of curvature of the substrate or a length of the electronic component, wherein the height difference is between the second component pad and the second substrate pad when the first component pad contacts the first substrate pad. A first conductive interposing layer is disposed on the first substrate pad or first component pad and a second conductive interposing layer is disposed on the second substrate pad or second component pad, a thickness difference between the first conductive interposing layer and the second conductive interposing layer is from 0.5 to 1 times the height difference; and the electronic component is disposed on the substrate, so that the first component pad and the second component pad are connected to the first substrate pad and the second substrate pad respectively.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

The present disclosure will now be described more fully with reference to the accompanying drawings, in which exemplary embodiments of the invention are shown. The terms used herein such as "on", "above", "below", "front", "back", "left" and "right" are for the purpose of describing directions in the figures only and are not intended to be limiting of the disclosure. Moreover, in the following embodiments, the same or similar reference numbers denote the same or like components.

The present disclosure is directed to an electronic device and a method for manufacturing the electronic device, which can reduce the stress difference on the bonding surface when the electronic component is disposed on a non-planar substrate.

Figure 1:
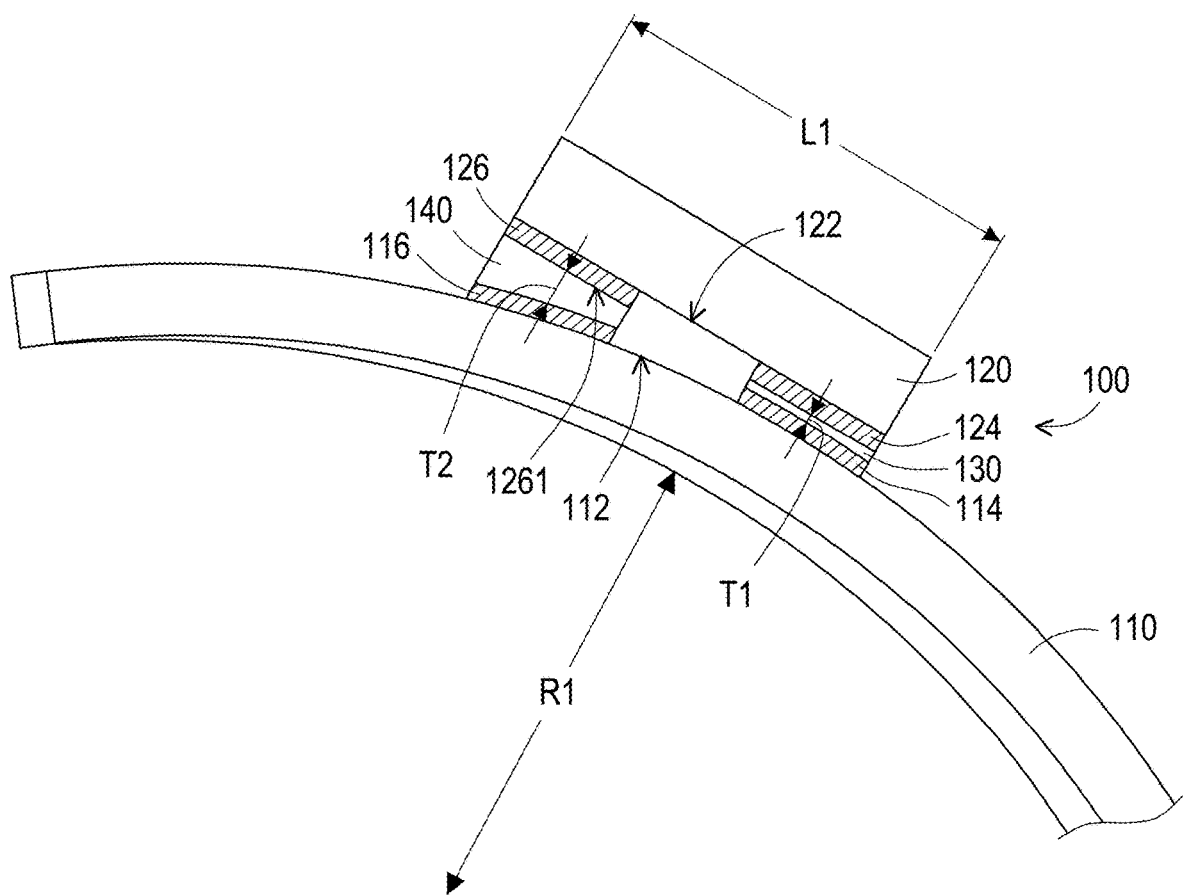
FIG. 1 is a schematic cross-sectional view of an electronic device according to an embodiment of the disclosure.
Figure 2:
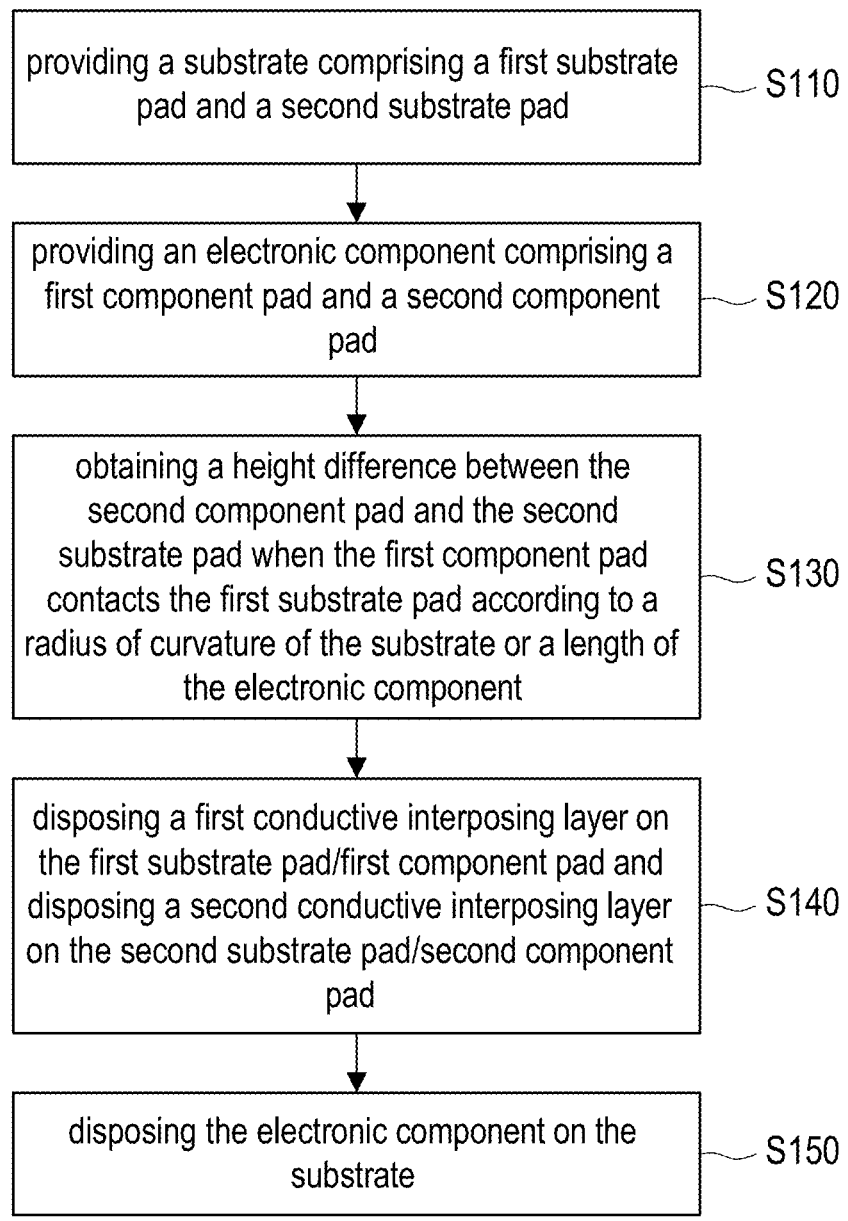
FIG. 2 is a schematic diagram of a manufacturing process of an electronic device according to an embodiment of the disclosure.

FIG. 1 is a schematic cross-sectional view of an electronic device according to an embodiment of the disclosure. FIG. 2 is a schematic diagram of a manufacturing process of an electronic device according to an embodiment of the disclosure. Referring to both FIG. 1 and FIG. 2, in the present embodiment, the electronic device 100 may include a substrate 110, an electronic component 120, a first conductive interposing layer 130, and a second conductive interposing layer 140 as shown in FIG. 1. The manufacturing method of the electronic device 100 of this embodiment may include the following steps. In one embodiment, step S110 is performed to provide a substrate 110. In some embodiments, the substrate 110 may include an insulating substrate and a conductive material disposed on the insulating substrate, wherein, the insulating substrate of the substrate 110 may include polyethylene terephthalate (PET), poly (ethylene terephthalateco-1, 4-cylclohexylenedimethylene terephthalate) (PETG), polycarbonate (PC), polyimide (PI), poly (methyl methacrylate) (PMMA), Polyethersulfone (PES), polydimethylsiloxane (PDMS), acrylic, any combination thereof or other suitable insulating substrates. In an embodiment, the substrate 110 may be formed by, for example, in-mold electronic (IME) technology. In-mold electronic technology can embed electronic components in injection molding devices, or the like, to form a double-sided molded component by molding two layers of film, one side is used for decoration, while film circuit is molded to the other side. Molding resin is usually injected between the two films. In this structure, the circuit including printed sensors, resistors, and other required components can form a fully functional independent component (circuit substrate) with an insulating substrate, and sealed with a molded resin. With this method, the substrate 110 can be easily formed into a polygonal (for example, a triangle, a rectangle, or a pentagon), an arc, a circle, or a structure with a shape that has at least one curved edge.

In some embodiments, the substrate 110 is a non-planar substrate. In the present embodiment, the substrate 110 is a curvy substrate. In other words, the substrate 110 includes a substrate bonding surface 112 for bonding with the electronic component 120, and the substrate bonding surface 112 is non-planar. In one embodiment, the curvature of the substrate bonding surface 112 is not zero, that is, the substrate bonding surface 112 is a curvy surface. In the present embodiment, the substrate 110 includes a plurality of substrate pads, where the substrate pad includes a first substrate pad 114 and a second substrate pad 116. Certainly, this disclosure does not limit the number of substrate pads on the substrate bonding surface 112. In an embodiment, the materials of the first substrate pad 114 and the second substrate pad 116 may include gold, silver, copper, aluminium, nickel, tin, alloys thereof, or any combination thereof. In the present embodiment, the material of the first substrate pad 114 and the second substrate pad 116 may be silver, but it is not limited thereto. In one embodiment, the radius of curvature R1 of the substrate 110 is substantially from about 20 mm to about 100 mm, the thickness of the substrate 110 is substantially from about 0.1 mm to about 5 mm. In addition, the Young's modulus of the substrate 110 can be substantially from about 0.5 GPa to about 20 GPa. Certainly, this disclosure is not limited thereto.

In one embodiment, step S120 is performed to provide an electronic component 120, where the electronic component 120 can be a light-emitting diode, a chip, or various other electronic component 120 suitable for being disposed on the substrate 110. In the present embodiment, the electronic component 120 may include a component bonding surface 122 for bonding with the substrate 110 and a plurality of component pads. In one embodiment, a plurality of component pads may be disposed on the component bonding surface 122. The component pads include a first component pad 124 and a second component pad 126. In addition, the first component pad 124 and the second component pad 126 face and correspond to the first substrate pad 114 and the second substrate pad 116 respectively, so as to form an electrical connection with the first substrate pad 114 and the second substrate pad 116 when the electronic component 120 is disposed on the substrate 110. Certainly, the present disclosure does not limit the number of component pads on the component bonding surface 122. In an embodiment, the materials of the first component pad 124 and the second component pad 126 may include gold, silver, copper, aluminium, nickel, tin, alloys thereof, or any combination thereof. In the present embodiment, the component bonding surface 122 of the electronic component 120 is a planar surface. That is, the curvature of the component bonding surface 122 is about zero. In other words, in the present embodiment, the electronic component 120 having the substantially planar component bonding surface 122 is disposed on the substrate 110 that is non-planar, e.g., curvy. Therefore, the bonding surface between the electronic component 120 and the substrate 110 to be bonded is not conformal and has a height difference, e.g., height difference $\Delta h$ as shown in FIG. 3.

Figure 3:
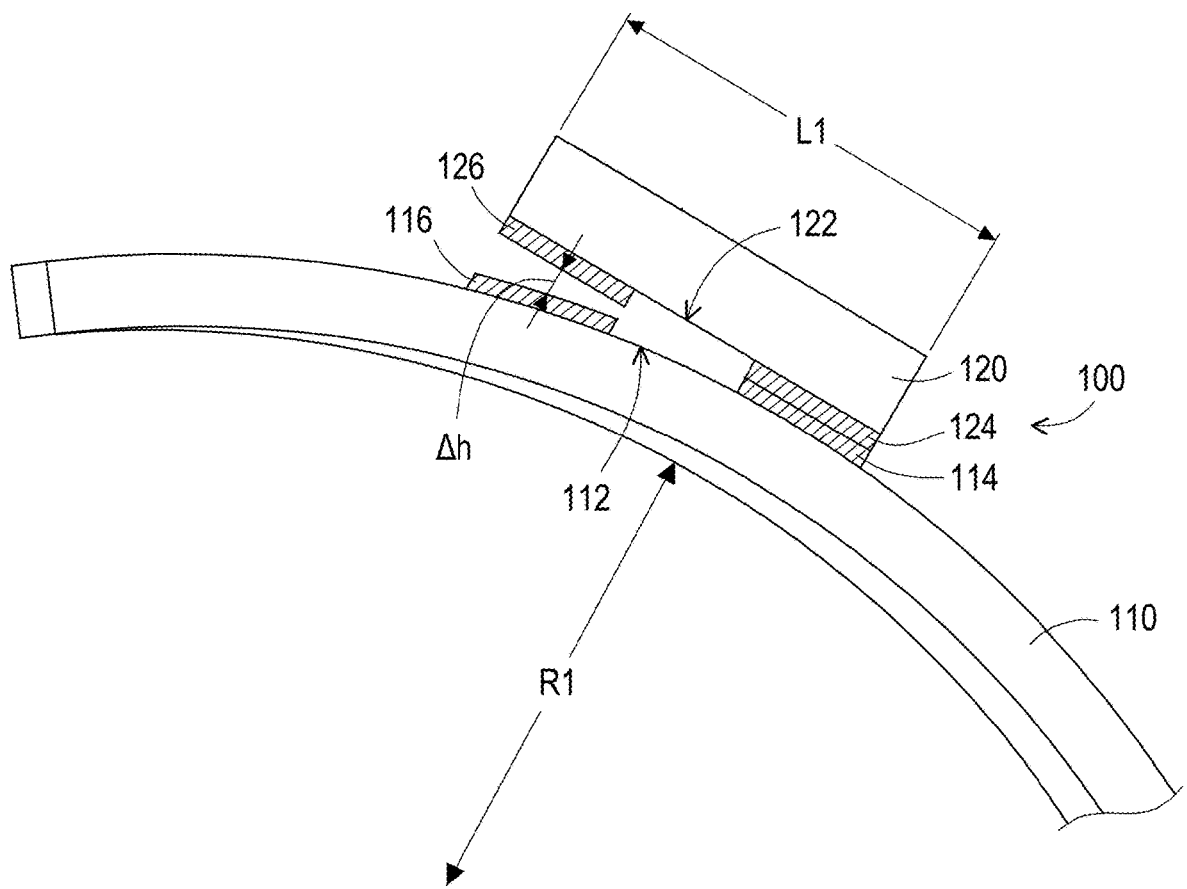
FIG. 3 is a schematic cross-sectional view of an electronic device in intermediate stages of the manufacturing process according to an embodiment of the disclosure.

FIG. 3 is a schematic cross-sectional view of an electronic device in intermediate stages of the manufacturing process according to an embodiment of the disclosure. Referring to FIG. 1 to FIG. 3, step S130 is then performed, the height difference $\Delta h$ between the second component pad 126 and the second substrate pad 116 when the first component pad 124 contacts the first substrate pad 114 is obtained according to the radius of curvature R1 of the substrate 110 or the length L1 of the electronic component 120. In detail, in the present embodiment, since the bonding surfaces between electronic component 120 and substrate 110 are not conformal, e.g., the substrate bonding surface 112 being a curvy surface, while the component bonding surface 122 being a planar surface, there is a height difference $\Delta h$ between the second component pad 126 and the second substrate pad 116 when the first component pad 124 contacts the first substrate pad 114. The height difference $\Delta h$ is the distance between the second component pad 126 and the second substrate pad 116 in a normal direction of the primary surface 1261 of the second component pad 126. This height difference $\Delta h$ would cause a greater difference, e.g., stress difference, between the bonding surface stress of the first substrate pad 114 and the first component pad 124 and the bonding surface stress of the second substrate pad 116 and the second component pad 126 when a pick and place device is utilized to apply pressure for disposing (pressing) the electronic component 120 onto the substrate 110. As such, the electrical connection and electrical performance between the substrate 110 and the electronic component 120 may be poor, and the electronic component 120 may even be damaged, such as deformation or cracking.

Figure 4:
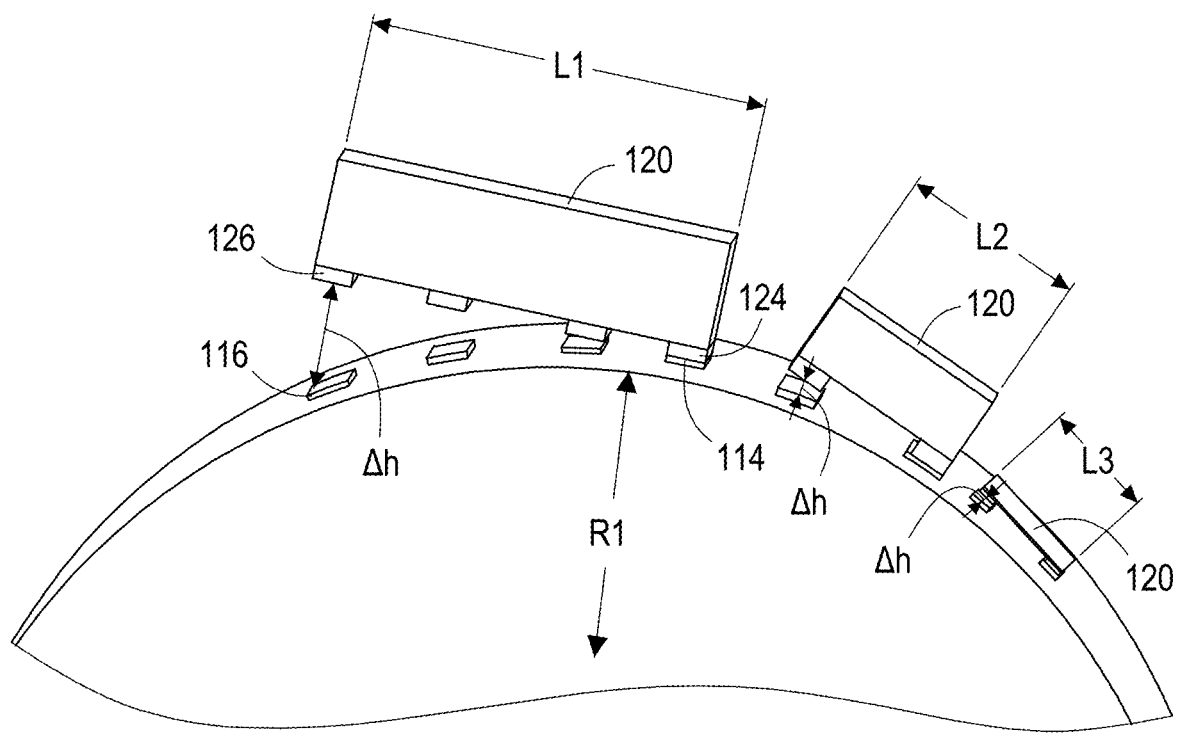
FIG. 4 is a schematic diagram of electronic components with different lengths disposed on a substrate according to an embodiment of the disclosure.

FIG. 4 is a schematic diagram of electronic components with different lengths disposed on a substrate according to an embodiment of the disclosure. Referring to FIG. 4, in the present embodiment, the first component pad 124 and the second component pad 126 may be two of the plurality of component pads that are farthest apart in the lengthwise direction. Therefore, the height difference Δh between the second component pad 126 and the second substrate pad 116 can be seen as the greatest height difference among the component pads and the substrate pads. Therefore, in order to control the stress difference between the electronic component 120 and the substrate 110, the height difference Δh between the second component pad 126 and the second substrate pad 116 needs to be firstly calculated, the height difference Δh is associated with the radius of curvature R1 of the substrate 110 or the length L1 of the electronic component 120. In the present embodiment, the relation between the radius of curvature R1/length L1 of the electronic component 120 and the height difference Δh of the pads 116 and 126 can be analysed based on big data and multivariate regression analysis methods.

In detail, the height difference Δh between the second component pad 126 and the second substrate pad 116 can be taken as the dependent variable, the radius of curvature R1 of the substrate 110 and the length L1 of the corresponding electronic component 120 can be taken as the argument to build a multivariate regression model, e.g., relation (formula). Then, based on the big data of multiple experiments, e.g., multiple substrates having different radiuses of curvature and/or multiple electronic components having different lengths, the coefficients, such as fixed coefficients and weight coefficients, in the multivariate regression model are calculated. Then, the calculated coefficient is substituted into the multivariate regression model to obtain a correction model of the height difference Δh between the pads 126 and 116. In this way, the actual radius of curvature R1 of the substrate 110 and/or the actual length L1 of the electronic component 120 can be substituted into the relation (formula) to obtain a estimated height difference Δh.

Figure 5:
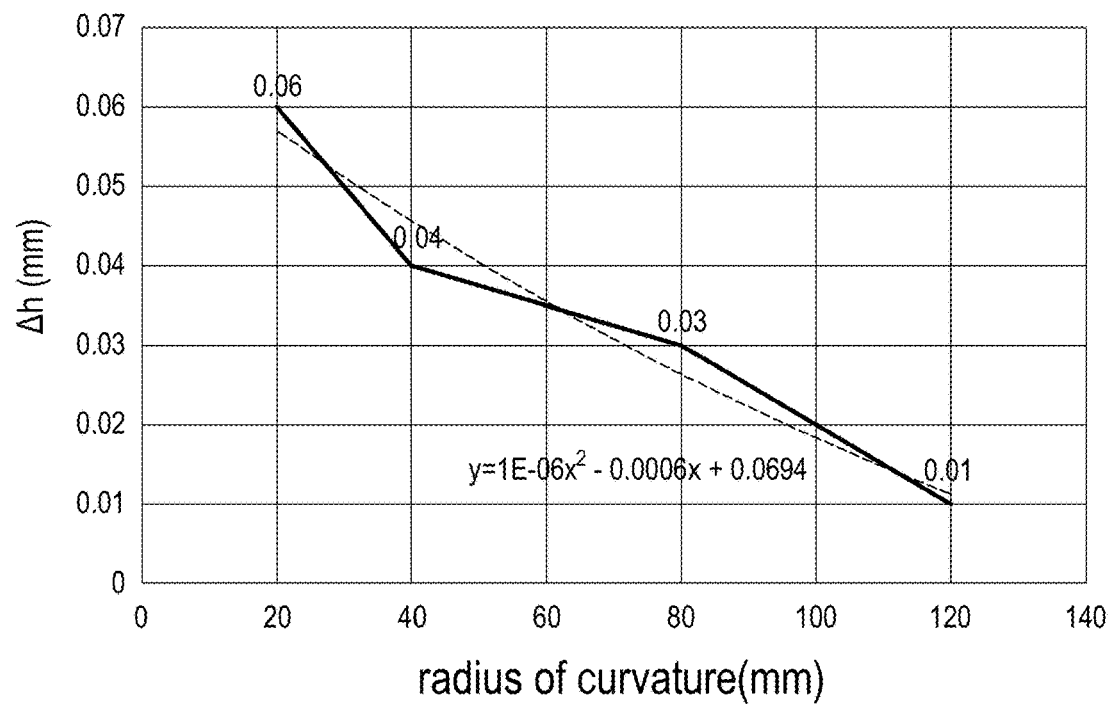
FIG. 5 is a schematic diagram of the relationship between the radius of curvature of the substrate of an electronic device and the height difference of the pads according to an embodiment of the present disclosure.

FIG. 5 is a schematic diagram of the relationship between the radius of curvature of the substrate of an electronic device and the height difference of the pads according to an embodiment of the present disclosure. Please refer to FIG. 3 and FIG. 5, for example, in the present embodiment, under the condition that the electronic component 120 has a specific (same) length L1, the height difference Δh between second component pad 126 and second substrate pad 116 is taken as the dependent variable, and the different radiuses of curvature of substrate 110 are taken as the arguments to build a multivariate regression model. Then, based on the big data of multiple experiments, e.g., multiple substrates having different radiuses of curvature, the coefficients, such as fixed coefficient and weight coefficient, etc., in the multivariate regression model are calculated, so as to obtain the relation between different radiuses of curvature of the substrate 110 and the height difference Δh. In the present embodiment, the relation (formula) between the radius of curvature R1 of the substrate 110 and the height difference Δh of the pads 116 and 126 is as follows:

$$y=1E-0.6x^2-0.0006x+0.0694$$

Wherein y represents the height difference Δh between the second component pad 126 and the second substrate pad 116, and x represents the radius of curvature of the substrate 110.

Accordingly, a correction model, illustrated as a dashed line in FIG. 5, of the height difference Δh between the second component pad 126 and the second substrate pad 116 can be obtained. Then, the radius of curvature R1 of the substrate 110 is substituted into the relation to obtain the estimated height difference Δh between the second component pad 126 and the second substrate pad 116.

Figure 6:
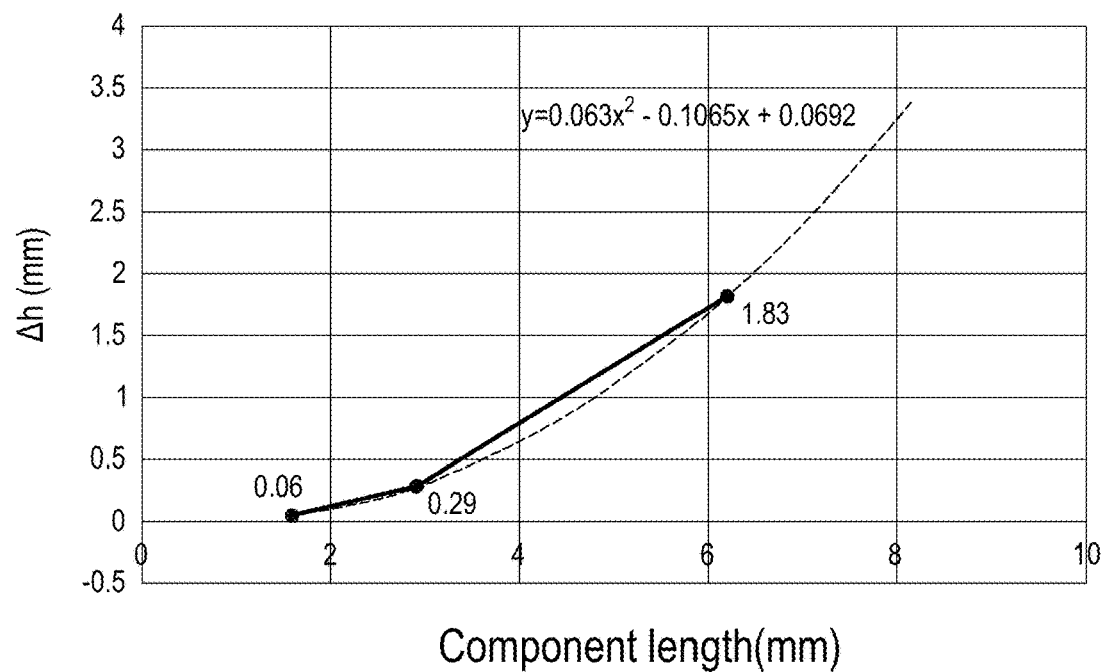
FIG. 6 is a schematic diagram of the relationship between the length of the electronic component of an electronic device and the height difference of the pads according to an embodiment of the disclosure.

FIG. 6 is a schematic diagram of the relationship between the length of the electronic component of an electronic device and the height difference of the pads according to an embodiment of the disclosure. Referring to FIG. 4 and FIG. 6, in another embodiment, under the condition that the substrate 110 has a specific (same) curvature R1, the height difference Δh between the second component pad 126 and the second substrate pad 116 is taken as the dependent variable, and the different lengths, such as lengths L1, L2, L3, of the electronic component 120 are taken as the argument to build a multivariate regression model. Then, based on the big data of multiple tests, e.g., multiple electronic components 120 having different lengths, the coefficients, such as fixed coefficients and weight coefficients, in the multivariate regression model are calculated, so as to obtain the relation between the different lengths and the height difference Δh of the electronic component 120. In the present embodiment, the relation between the different lengths of the electronic component 120 and the height difference Δh of the pads 116 and 126 is as follows:

$$y=0.063x^2-0.1065x+0.0692$$

Wherein y represents the height difference Δh between the second component pad 126 and the second substrate pad 116, and x represents the length of the electronic component 120.

Accordingly, a correction model, illustrated as a dashed line in FIG. 6, of the height difference Δh between the second component pad 126 and the second substrate pad 116 can be obtained. Then, the length L1 of the electronic component 120 is substituted into the relation to obtain the estimated height difference Δh between the second component pad 126 and the second substrate pad 116.

Figure 7:
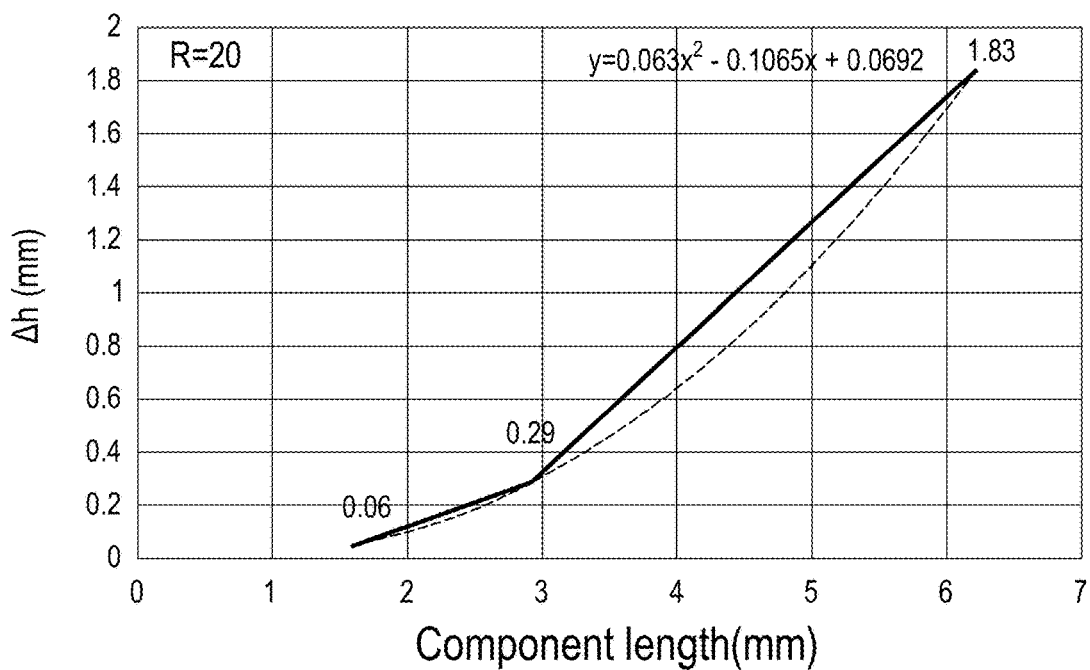
FIG. 7 to FIG. 10 are schematic diagrams of the relationship between the length of the electronic component and the height difference of the pad under the conditions that the substrate has different radius of curvature in an electronic device according to an embodiment of the present disclosure.
Figure 8:
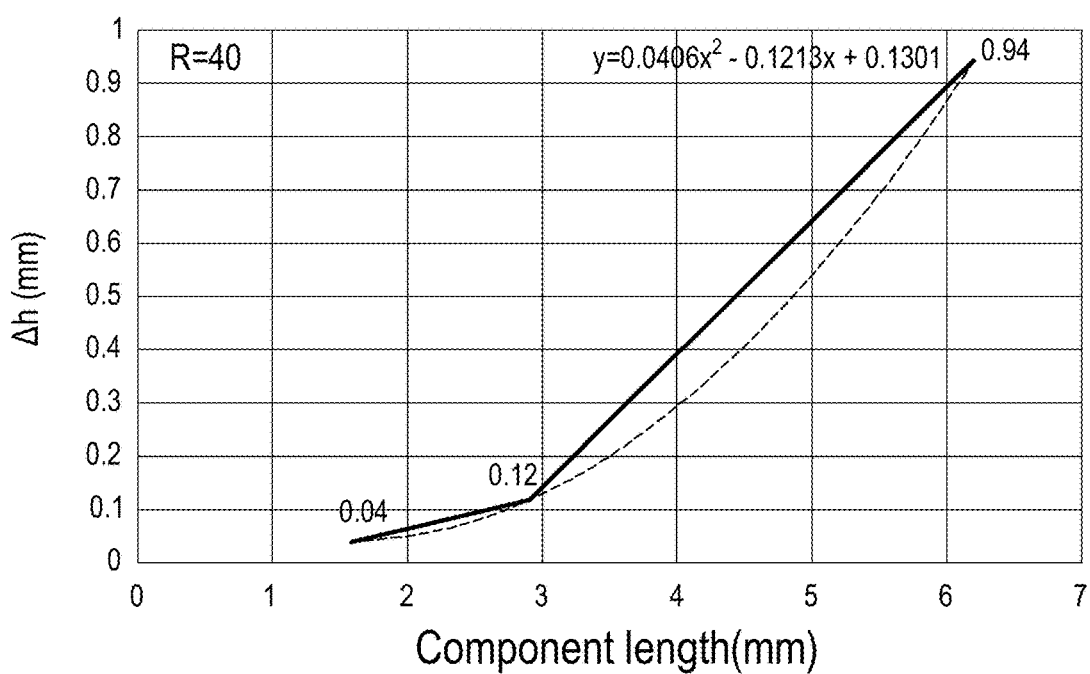
Figure 9:
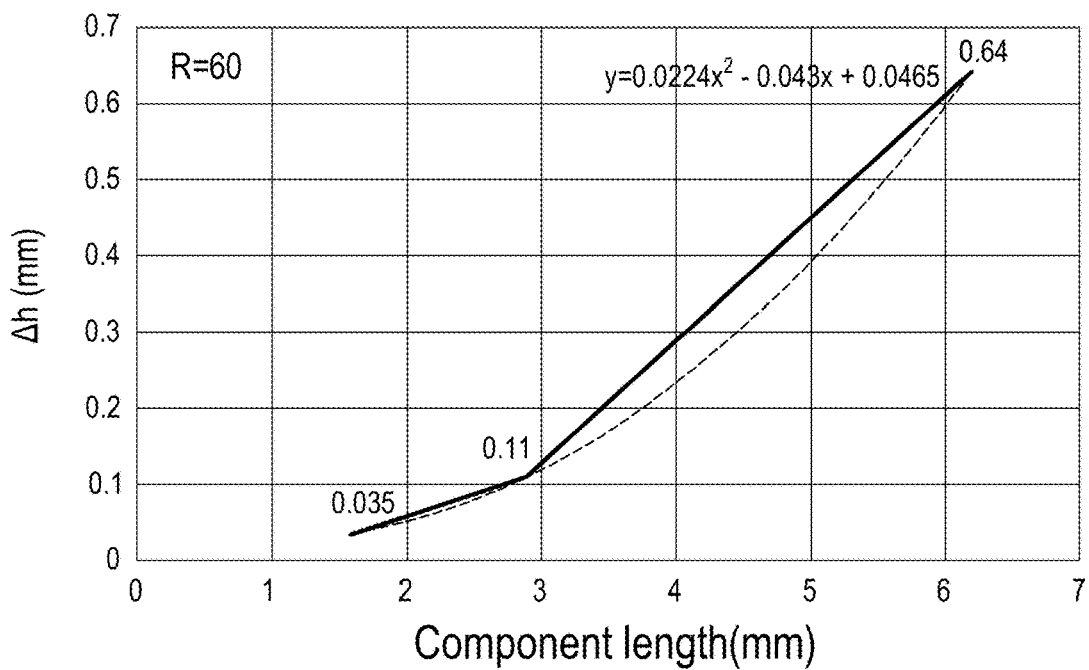
Figure 10:
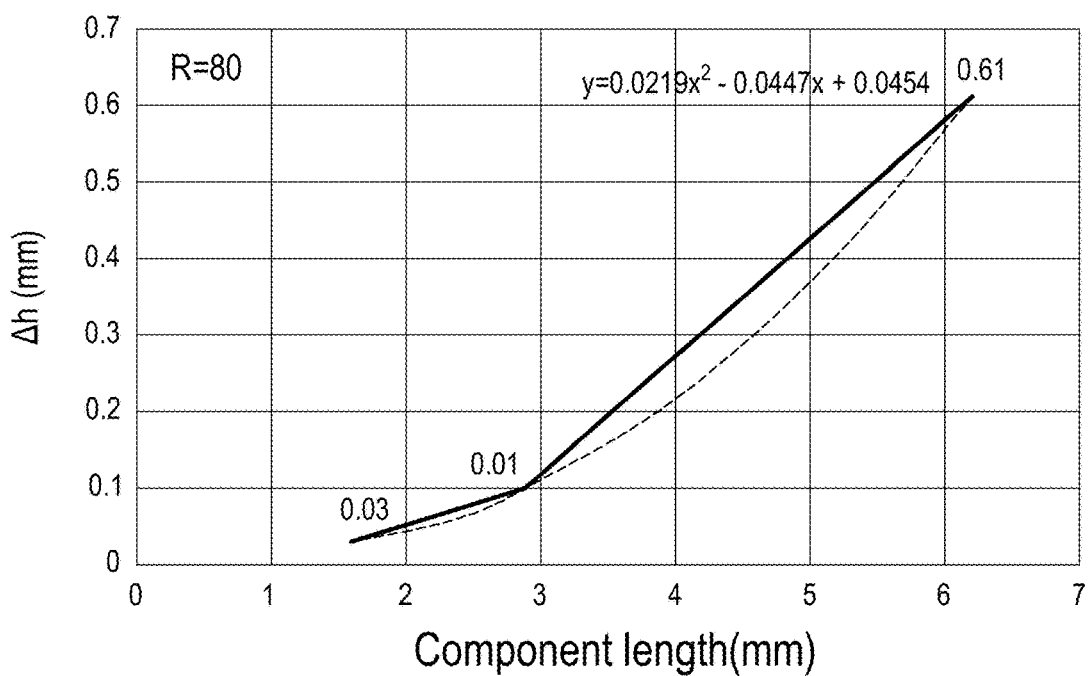

FIG. 7 to FIG. 10 are schematic diagrams of the relationship between the length of the electronic component and the height difference of the pad under the conditions that the substrate has different radius of curvature in an electronic device according to an embodiment of the present disclosure. In another embodiment, FIG. 7 to FIG. 10 respectively show that the substrate 110 is in different radiuses of curvature. For example, the radius of curvature of the substrate 110 in FIG. 7 is 20 mm, the radius of curvature of the substrate 110 in FIG. 8 is 40 mm, the radius of curvature of the substrate 110 in FIG. 9 is 60 mm, and the radius of curvature of substrate 110 in FIG. 10 is 80 mm, the height difference Δh between the second component pad 126 and the second substrate pad 116 is taken as the dependent variable, and the different lengths of the electronic component 120 is taken as the argument to build a multivariate regression model. Then, based on the big data of multiple experiments, e.g., multiple substrate 110 having different radiuses of curvature and multiple electronic component 120 having different lengths, the coefficients, such as fixed coefficient and weight coefficient, etc., in the multivariate regression model are calculated, so as to obtain the relations between the length of the electronic component 120 and the height difference Δh of the pads 116 and 126 under the conditions that the substrate 110 is in different radiuses of curvature.

In the embodiment of FIG. 7, under the condition that the radius of curvature of the substrate 110 is 20 mm, the relation between the different lengths of the electronic component 120 and the height difference Δh of the pads 116 and 126 is as follows:

$$y=0.063x^2-0.1065x+0.0692$$

Wherein y represents the height difference Δh between the second component pad 126 and the second substrate pad 116, and x represents the length of the electronic component 120.

In the embodiment of FIG. 8, under the condition that the radius of curvature of the substrate 110 is 40 mm, the relation between the different lengths of the electronic component 120 and the height difference Δh of the pads 116 and 126 is as follows:

$$y=0.0406x^2-0.1213x+0.1301$$

Wherein y represents the height difference Δh between the second component pad 126 and the second substrate pad 116, and x represents the length of the electronic component 120.

In the embodiment of FIG. 9, under the condition that the radius of curvature of the substrate 110 is 60 mm, the relation between the different lengths of the electronic component 120 and the height difference Δh of the pads 116 and 126 is as follows:

$$y=0.0224x^2-0.043x+0.0465$$

Wherein y represents the height difference Δh between the second component pad 126 and the second substrate pad 116, and x represents the length of the electronic component 120.

In the embodiment of FIG. 10, under the condition that the radius of curvature of the substrate 110 is 80 mm, the relation between the different lengths of the electronic component 120 and the height difference Δh of the pads 116 and 126 is as follows:

$$y=0.0219x^2-0.0447x+0.0454$$

Wherein y represents the height difference Δh between the second component pad 126 and the second substrate pad 116, and x represents the length of the electronic component 120.

After that, the radius of curvature R1 of the substrate 110 and the length L1 of the electronic component 120 are substituted into the corresponding relation that meets the conditions, and the estimated height difference Δh between the second component pad 126 and the second substrate pad 116 can be obtained.

Referring now back to FIG. 1 and FIG. 2, after the height difference Δh between the pads 116 and 126 is obtained by using multivariate regression analysis according to the method described above. The conductive interposing layers 130 and 140 disposed between the substrate pads 114 and 116 and the component pads 124 and 126 can be used to compensate the height difference Δh between the pads 116 and 126. To be more specific, step S140 is then performed to dispose the first conductive interposing layer 130 on the first substrate pad 114 or the first component pad 124, and dispose the second conductive interposing layer 140 on the second substrate pad 116 or the second component pad 126. In addition, the thickness T2 of the second conductive interposing layer 140 is designated to be substantially greater than the thickness T1 of the first conductive interposing layer 130, so as to utilize the second conductive interposing layer 140 with greater thickness T2 to compensate the height difference Δh between the pads 116 and 126. In one embodiment, the materials of the first conductive interposing layer 130 and the second conductive interposing layer 140 may include gold, silver, copper, aluminium, nickel, tin, alloys thereof, or any combination thereof. In another embodiment, the materials of the first conductive interposing layer 130 and the second conductive interposing layer 140 may include PEDOT, graphene, indium tin oxide (ITO), or any combination thereof. In one embodiment, the method of disposing the first conductive interposing layer 130 and the second conductive interposing layer 140 includes (gel) dispensing. Certainly, this disclosure is not limited thereto.

Through the stress simulations in big data analytics, it is known that, when the thickness difference (T2−T1) between the first conductive interposing layer 130 and the second conductive interposing layer 140 is from 0.5 to 1 times the height difference Δh, the difference in bonding surface stress between the pads is less than about 10%, which meets the requirements of product yield. Therefore, in the present embodiment, the thickness difference (T2−T1) between the first conductive interposing layer 130 and the second conductive interposing layer 140 is designed to be between 0.5 and 1 times the height difference Δh. With this configuration, there is a first bonding surface stress between the first substrate pad 114 and the first component pad 124, there is a second bonding surface stress between the second substrate pad 116 and the second component pad 126, and the difference between the first bonding surface stress and the second bonding surface stress is less than about 10%. For example, the thickness difference (T2−T1) between the first conductive interposing layer 130 and the second conductive interposing layer 140 can be designed to be about ⅔ times the height difference Δh. It is found through stress simulation analysis that such configuration not only makes the difference between the first bonding surface stress and the second bonding surface stress less than about 10%, but the actual values (readings) of the first bonding surface stress and the second bonding surface stress are also significantly reduced.

Accordingly, taking the embodiment of FIG. 5 as an example, when the curvy substrate 110 is in convex warpage, the data obtained through the steps described above is shown in Table 1 below:

TABLE 1

| L1(mm) | R1(mm) | (0.5~1)Δh(mm) | ⅔Δh(mm) | relation |
|---|---|---|---|---|
| 1.6 × 0.8 | 20 | 0.06~0.03 | 0.04 | y = 1E−06x² − 0.0006x + 0.0694 |
| | 40 | 0.05~0.025 | 0.03 | |
| | 60 | 0.04~0.02 | 0.02 | |
| | 80 | 0.028~0.014 | 0.01 | |
| | 100 | 0.019~0.0095 | 0.01 | |

In another embodiment, when the curvy substrate 110 is in concave warpage, the data obtained through the steps described above is shown in Table 2 below:

TABLE 2

| Size(mm) | radius of curvature (mm) | (0.5~1)Δh(mm) | 2/3Δh(mm) | relation |
|---|---|---|---|---|
| 1.6 × 0.8 | 20 | 0.06~0.03 | 0.04 | y = −1E−06x$^2$ − 0.0006x + 0.0694 |
|  | 40 | 0.05~0.025 | 0.03 |  |
|  | 60 | 0.04~0.02 | 0.02 |  |
|  | 80 | 0.028~0.014 | 0.01 |  |
|  | 100 | 0.019~0.0095 | 0.01 |  |

Herein, the data in the first column represents the size of electronic component 120; the data in the second column represents the radius of curvature of substrate 110; the data in the third column represents the range of the thickness difference (T2−T1), i.e., 0.5Δh to 1Δh, between the first conductive interposing layer 130 and the second conductive interposing layer 140; the data in the fourth column represents the selected thickness difference (T2−T1), i.e., ⅔Δh, between the first conductive interposing layer 130 and the second conductive interposing layer 140, the fifth column represents the relation between the radius of curvature of the substrate 110 and the height difference Δh between the pads 116 and 126.

Figure 11:
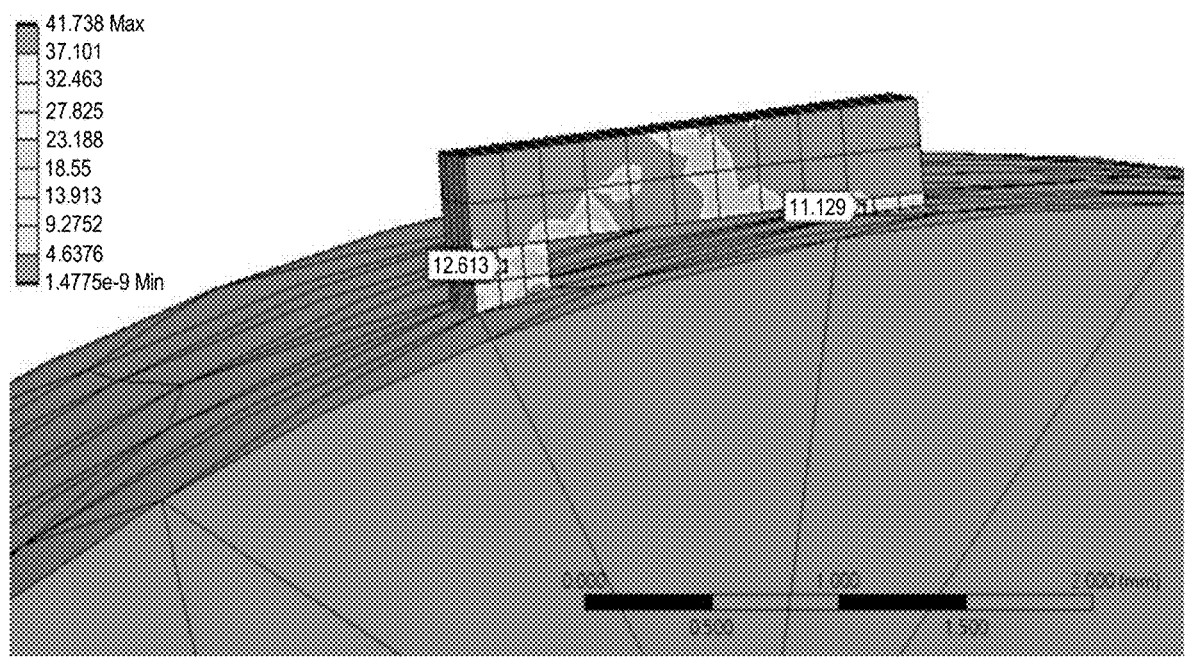
FIG. 11 is a schematic diagram of the stress distribution of an electronic device under pressure according to an embodiment of the disclosure.

FIG. 11 is a schematic diagram of the stress distribution of an electronic device under pressure according to an embodiment of the disclosure. Referring to FIG. 1 and FIG. 11, the step S150 is then performed, wherein the electronic component 120 is disposed on the substrate 110 so that the first component pad 124 and the second component pad 126 are connected to the first substrate pad 114 and the second substrate pad 116 through the first conductive interposing layer 130 and the second conductive interposing layer 140 respectively. In the present embodiment, the electronic component 120 can be picked up and placed on the substrate 110 by, for example, a pick and place device, and a pressure is applied to the electronic component 120 through the nozzle of the device, so that the electronic component 120 is pressed against the substrate 110. The first conductive interposing layer 130 and the second conductive interposing layer 140 with different thicknesses, for example, the thickness difference (T2−T1) being ⅔Δh, are used to compensate the height difference Δh between the pads 116 and 126, such that the difference between the first bonding surface stress between the first substrate pad 114 and the first component pad 124 and the second bonding surface stress between the second substrate pad 116 and the second component pad 126 is less than about 10%.

For example, FIG. 11 is a schematic diagram of stress simulation analysis of an embodiment in which the radius of curvature R1 of the substrate 110 in Table 1 is 40 mm, it can be seen from FIG. 11 that, after the electronic component 120 and the substrate 110 are pressed together, the first bonding surface stress between the first substrate pad 114 and the first component pad 124 is about 11.129 MPa, the second bonding surface stress between the second substrate pad 116 and the second component pad 126 is about 12.613 MPa. It is shown that the difference between the first bonding surface stress and the second bonding surface stress is indeed less than 10%. Therefore, the electronic device 100 of the embodiment in the present disclosure can effectively improve the electrical performance and the yield of electrical connection between the electronic component 120 and the substrate 110, and can further improve the reliability of the electronic device 100.

Figure 12:
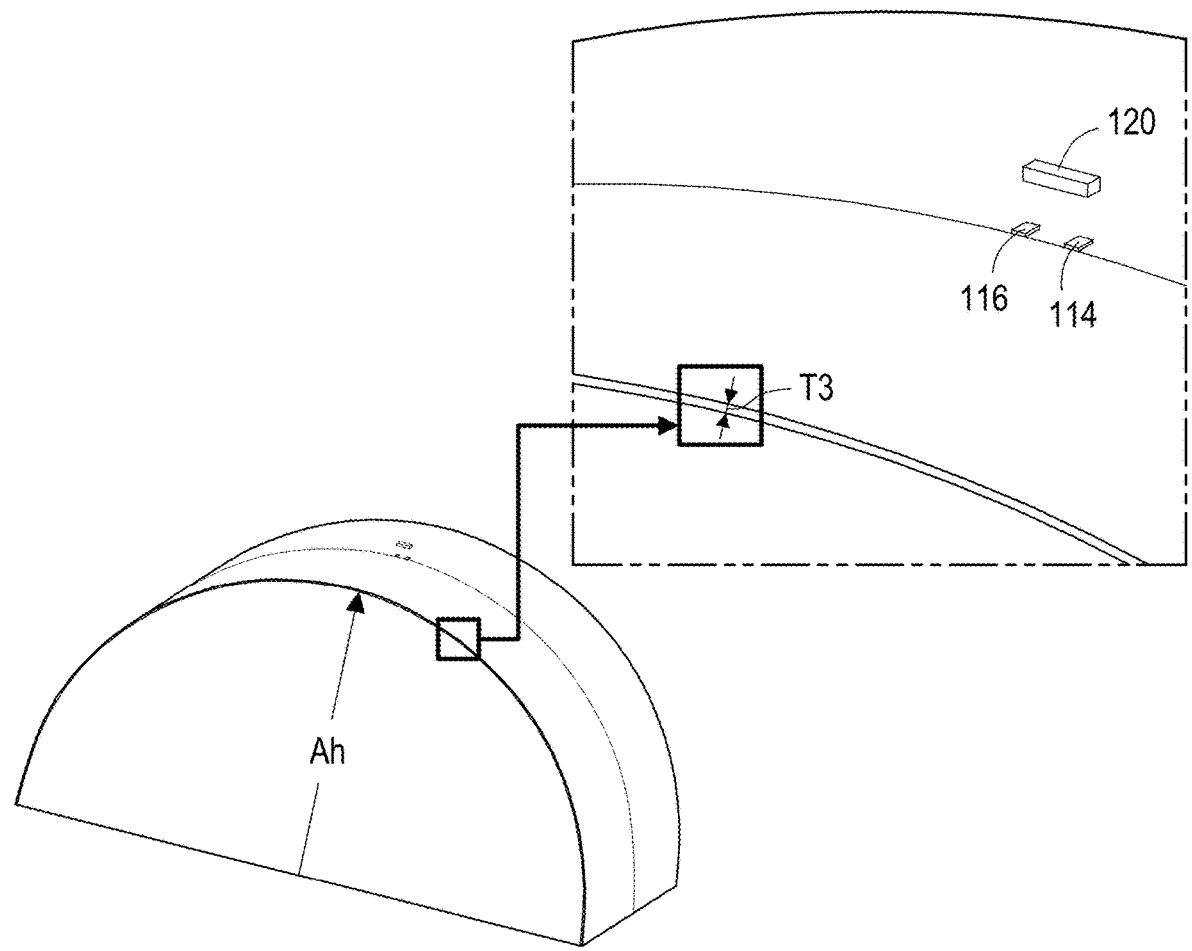
FIG. 12 is a schematic diagram of the height of arc and thickness of a substrate of an electronic device according to an embodiment of the disclosure.

FIG. 12 is a schematic diagram of the height of arc and thickness of a substrate of an electronic device according to an embodiment of the disclosure. As in the previous embodiments, the thickness of the substrate is from 0.1 mm to 5 mm, and the Young's modulus of the substrate is from 0.5 GPa to 20 GPa. Referring to FIG. 12, in some embodiments, the substrate 110 may also be specially designed to further reduce the bonding surface stress between the electronic component 120 and the substrate 110. To be more specific, the bonding surface stress between the electronic component 120 and the substrate 110 can be adjusted by controlling the ratio of the thickness T3 of the substrate 110 to the height of arc Ah of the substrate 110. Generally speaking, height of arc Δh refers to the vertical distance between the main spring coil and the center of the coil. In the curvy substrate 110, the height of arc Ah of the substrate 110 at a certain location can represent the degree of curvature and convexity/concavity of the substrate 110 at that location.

For example, Table 3 below lists the values of the bonding surface stress between the electronic component 120 and the substrate 110 under the conditions of the electronic device being in different thicknesses and different heights of arc Ah.

TABLE 3

| substrate height of arc (mm) | substrate thickness (mm) | thickness/ height of arc | Stress (MPa) |
|---|---|---|---|
| 20 | 0.018 | 0.0009 | 15.52 |
| 30 | 0.02 | 0.00066 | 15.75 |
| 40 | 0.03 | 0.00075 | 15.66 |
| 50 | 0.04 | 0.0008 | 15.617 |
| 60 | 0.05 | 0.00083 | 15.5886 |
| 70 | 0.06 | 0.00086 | 15.561 |
| 80 | 2 | 0.025 | 3 |

It is shown in Table 3 that, when the ratio of the thickness T3 of the substrate 110 to the height of arc Ah of the substrate 110 is about equal to 0.025, the bonding surface stress between the electronic component 120 and the substrate 110 is significantly reduced to 3 MPa. Therefore, in the present embodiment, the electronic device can be designed as the ratio of the thickness T3 of the substrate 110 to the height of arc Ah of the substrate 110 being greater than or substantially equal to 0.025, so as to reduce the bonding surface stress between the electronic component 120 and the substrate 110 to an acceptable range.

In summary, in the electronic device and the manufacturing method thereof in the disclosed embodiment, the electronic component is disposed on a non-planar substrate, and utilize the thickness difference between the conductive interposing layer between the substrate pad and the component pad to compensate for the height difference between the substrate pad and the component pad, so as to reduce difference of the bonding surface stress between the electronic component and the substrate. The height difference between the substrate pad and the component pad can be obtained according to the radius of curvature of the substrate or the length of the electronic component, and the thickness difference between the corresponding conductive interposing layers is substantially from 0.5 to 1 times the height difference. With such configuration, the difference between the bonding surface stresses of the electronic component and the substrate can be less than about 10%, which can effectively improve the electrical performance and the yield of electrical connection between the electronic component and the substrate, and also improve the reliability of the electronic device.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An electronic device, comprising:
    a substrate comprising a substrate bonding surface, which is non-planar, and a first substrate pad and a second substrate pad disposed on the substrate bonding surface;
    an electronic component comprising a component bonding surface and a first component pad and a second component pad disposed on the component bonding surface and corresponding to the first substrate pad and the second substrate pad respectively, wherein the component bonding surface is a planar surface, and there is a height difference between the second component pad and the second substrate pad when the first component pad contacts the first substrate pad;
    a first conductive interposing layer connected between the first substrate pad and the first component pad; and
    a second conductive interposing layer connected between the second substrate pad and the second component pad, wherein a thickness difference between the first conductive interposing layer and the second conductive interposing layer is from 0.5 to 1 times the height difference.

2. The electronic device according to claim 1, wherein the height difference is related to a radius of curvature of the substrate or a length of the electronic component.

3. The electronic device according to claim 1, wherein the thickness difference is ⅔ times the height difference.

4. The electronic device according to claim 1, wherein the electronic component comprises a plurality of component pads, the first component pad and the second component pad are respectively two of the plurality of component pads that are farthest apart in a lengthwise direction.

5. The electronic device according to claim 1, wherein the height difference is a distance between the second component pad and the second substrate pad in a normal direction of a primary surface of the second component pad.

6. The electronic device as described in claim 1, the material of the substrate comprises polyethylene terephthalate (PET), PETG, polycarbonate (PC), polyimide (PI), poly(methyl methacrylate) (PMMA), Polyethersulfone (PES), polydimethylsiloxane (PDMS), acrylic, or any combination thereof.

7. The electronic device according to claim 1, wherein the materials of the first conductive interposing layer and the second conductive interposing layer comprise gold, silver, copper, aluminum, nickel, tin, alloys thereof, or any combination thereof.

8. The electronic device as described in claim 1, there is a first bonding surface stress between the first substrate pad and the first component pad, there is a second bonding surface stress between the second substrate pad and the second component pad, and a difference between the first bonding surface stress and the second bonding surface stress is less than or equal to 10%.

9. The electronic device according to claim 1, wherein a radius of curvature of the substrate is from 20 mm to 100 mm.

10. An electronic device, comprising:
    a substrate comprising a substrate bonding surface, which is non-planar, and a first substrate pad and a second substrate pad disposed on the substrate bonding surface, wherein a ratio between a thickness and a height of arc of the substrate is greater than or equal to 0.025; and
    an electronic component comprising a component bonding surface and a first component pad and a second component pad that are disposed on the component bonding surface and respectively bonded with the first substrate pad and the second substrate pad.

11. The electronic device according to claim 10, wherein a thickness of the substrate is from 0.1 mm to 5 mm.

12. The electronic device according to claim 10, wherein a Young's modulus of the substrate is from 0.5 GPa to 20 GPa.

13. A method of manufacturing an electronic device, comprising:
    providing a substrate, wherein the substrate comprises a substrate bonding surface, which is non-planar, and a first substrate pad and a second substrate pad disposed on the substrate bonding surface;
    providing an electronic component, wherein the electronic component comprises a first component pad and a second component pad corresponding to the first substrate pad and the second substrate pad respectively;
    obtaining a height difference between the second component pad and the second substrate pad when the first component pad contacts the first substrate pad according to a radius of curvature of the substrate or a length of the electronic component;
    providing a first conductive interposing layer on the first substrate pad or the first component pad and providing a second conductive interposing layer on the second substrate pad or the second component pad, wherein a thickness difference between the first conductive interposing layer and the second conductive interposing layer is from 0.5 to 1 times the height difference; and
    placing the electronic component on the substrate, such that the first component pad and the second component pad are respectively connected to the first substrate pad and the second substrate pad.

14. The method for manufacturing the electronic device according to claim 13, wherein the method for obtaining the height difference comprises:
    under condition that the electronic component has the length, using multivariate regression analysis to obtain a relation between the radius of curvature of the substrate and the height difference; and
    substituting the radius of curvature of the substrate into the relation to obtain the height difference.

15. The method for manufacturing the electronic device according to claim 13, wherein the method for obtaining the height difference comprises:
    under conditions of different radiuses of curvature of the substrate, using multivariate regression analysis to obtain a plurality of relations between different lengths of the electronic component and the height difference; and
    substituting the radius of curvature of the substrate and the length of the electronic component into corresponding one of the relations to obtain the height difference.

16. The method of manufacturing the electronic device according to claim 13, wherein the thickness difference is ⅔ times the height difference.

17. The method for manufacturing the electronic device according to claim 13, wherein the height difference is a distance between the second component pad and the second substrate pad in a normal direction of a primary surface of the second component pad.

18. The method of manufacturing the electronic device according to claim 13, wherein the method of providing the first conductive interposing layer and the second conductive interposing layer comprises dispensing.

19. The method of manufacturing the electronic device according to claim 13, wherein placing the electronic component on the substrate comprises picking up the electronic component by a pick-and-place device and applying a pressure to press the electronic component against the substrate.

* * * * *